United States Patent
Silva et al.

(10) Patent No.: US 9,587,312 B2
(45) Date of Patent: Mar. 7, 2017

(54) GAS INLET MEMBER OF A CVD REACTOR

(75) Inventors: Hugo Silva, Aachen (DE); Nico Jouault, Toulouse (FR); Victor Saywell, Great Barton (GB); Fred Crawley, Orwell Royston (GB); Martin Dauelsberg, Aachen (DE); Johannes Lindner, Roetgen (DE)

(73) Assignee: AIXTRON SE, Herzogenrath (DE)

( * ) Notice: Subject to any disclaimer, the term of this patent is extended or adjusted under 35 U.S.C. 154(b) by 447 days.

(21) Appl. No.: 14/232,246

(22) PCT Filed: Jul. 5, 2012

(86) PCT No.: PCT/EP2012/063072
§ 371 (c)(1),
(2), (4) Date: Sep. 23, 2014

(87) PCT Pub. No.: WO2013/007580
PCT Pub. Date: Jan. 17, 2013

(65) Prior Publication Data
US 2015/0007771 A1 Jan. 8, 2015

(51) Int. Cl.
*C23C 16/455* (2006.01)
*C23C 16/30* (2006.01)
*C30B 25/14* (2006.01)

(52) U.S. Cl.
CPC ...... *C23C 16/45591* (2013.01); *C23C 16/301* (2013.01); *C23C 16/45565* (2013.01);
(Continued)

(58) Field of Classification Search
CPC ........ C23C 16/45591; C23C 16/45572; C23C 16/301; C23C 16/45574; C23C 16/45565; C23C 16/45576; C30B 25/14
See application file for complete search history.

(56) References Cited

U.S. PATENT DOCUMENTS 5,670,218 A * 9/1997 Baek ................... C23C 16/409
118/50
5,871,586 A * 2/1999 Crawley ........... C23C 16/45514
118/715
(Continued)

FOREIGN PATENT DOCUMENTS

DE 69706248 T2 3/2002
DE 10320597 A1 12/2004
(Continued)

OTHER PUBLICATIONS

Aixtron SE; International Application No. PCT/EP/2012/063072 filed Jul. 5, 2012; International Search Report and Written Opinion, ISA/EP; Sep. 14, 2012; 14 pages.
(Continued)

*Primary Examiner* — Jeffrie R Lund
(74) *Attorney, Agent, or Firm* — Ascenda Law Group, PC

(57) ABSTRACT

A gas inlet member of a CVD reactor includes a gas inlet housing having a gas distribution volume supplied with a process gas by a feed line and a multiplicity of gas lines, each formed as a tube and engaging openings of a gas outlet plate arranged in front of an inlet housing wall, and through which the process gas enters a process chamber. A coolant chamber adjoins the gas inlet housing wall and a coolant cools the gas inlet housing wall and outlet ends of the gas lines that are in heat-conductive contact with the gas inlet housing wall. The gas outlet plate is thereby thermally decoupled from the gas inlet housing wall such that the gas outlet plate, which is acted on by radiation heat coming from the process chamber, heats up more intensely than the outlet ends which extend into the openings of the gas outlet plate.

13 Claims, 8 Drawing Sheets

(52) U.S. Cl.
CPC .. *C23C 16/45572* (2013.01); *C23C 16/45574* (2013.01); *C23C 16/45576* (2013.01); *C30B 25/14* (2013.01)

(56) References Cited

U.S. PATENT DOCUMENTS

| | | | | |
|---|---|---|---|---|
| 6,435,428 B2* | 8/2002 | Kim | C23C 16/452 | 239/553 |
| 6,544,341 B1 | 4/2003 | Omstead et al. | | |
| 6,565,661 B1* | 5/2003 | Nguyen | C23C 16/4557 | 118/715 |
| 6,886,491 B2* | 5/2005 | Kim | C23C 16/45514 | 118/723 E |
| 7,018,940 B2* | 3/2006 | Dunham | C23C 16/455 | 118/715 |
| 7,410,676 B2* | 8/2008 | Kim | C23C 16/45514 | 117/92 |
| 7,479,303 B2* | 1/2009 | Byun | C23C 16/45519 | 118/715 |
| 7,931,749 B2* | 4/2011 | Amikura | C23C 16/45565 | 118/715 |
| 7,976,631 B2* | 7/2011 | Burrows | C23C 16/45565 | 118/715 |
| 8,298,370 B2* | 10/2012 | Byun | C23C 16/45519 | 118/715 |
| 8,361,892 B2* | 1/2013 | Tam | C23C 16/45519 | 118/715 |
| 8,481,118 B2* | 7/2013 | Burrows | C23C 16/45565 | 118/715 |
| 8,679,956 B2* | 3/2014 | Tam | C23C 16/45519 | 118/715 |
| 8,882,913 B2* | 11/2014 | Byun | C23C 16/40 | 118/715 |
| 8,960,235 B2* | 2/2015 | Carlson | C23C 16/45565 | 118/715 |
| 9,057,128 B2* | 6/2015 | Olgado | C23C 16/45565 | |
| 9,315,897 B2* | 4/2016 | Byun | C23C 16/45572 | |
| 2001/0042799 A1* | 11/2001 | Kim | C23C 16/452 | 239/553 |
| 2002/0129769 A1* | 9/2002 | Kim | C23C 16/45514 | 118/723 E |
| 2004/0127067 A1* | 7/2004 | Dunham | C23C 16/455 | 438/778 |
| 2005/0092248 A1* | 5/2005 | Lee | C23C 16/45565 | 118/715 |
| 2005/0217582 A1* | 10/2005 | Kim | C23C 16/45514 | 118/723 E |
| 2005/0255257 A1* | 11/2005 | Choi | C23C 16/345 | 427/585 |
| 2006/0021574 A1 | 2/2006 | Armour et al. | | |
| 2006/0263522 A1* | 11/2006 | Byun | C23C 16/45519 | 427/248.1 |
| 2007/0095284 A1* | 5/2007 | Iizuka | C23C 16/45565 | 118/715 |
| 2007/0148349 A1* | 6/2007 | Fukada | C23C 16/45565 | 427/248.1 |
| 2007/0163440 A1* | 7/2007 | Kim | C23C 16/45565 | 96/52 |
| 2007/0272154 A1* | 11/2007 | Amikura | C23C 16/45565 | 118/719 |
| 2008/0020146 A1* | 1/2008 | Choi | C23C 16/345 | 427/446 |
| 2008/0124463 A1* | 5/2008 | Bour | C23C 16/45514 | 427/255.28 |
| 2009/0071403 A1* | 3/2009 | Choi | C23C 16/24 | 118/722 |
| 2009/0169744 A1* | 7/2009 | Byun | C23C 16/40 | 427/255.28 |
| 2009/0178616 A1* | 7/2009 | Byun | C23C 16/45519 | 118/715 |
| 2010/0003405 A1* | 1/2010 | Kappeler | C23C 16/45551 | 427/255.28 |
| 2010/0170438 A1* | 7/2010 | Saywell | B23K 20/023 | 118/715 |
| 2010/0181024 A1* | 7/2010 | White | C23C 16/45565 | 156/345.33 |
| 2011/0023782 A1* | 2/2011 | Han | C23C 16/45565 | 118/724 |
| 2011/0030615 A1* | 2/2011 | Griffin | C23C 16/4405 | 118/666 |
| 2011/0052833 A1* | 3/2011 | Hanawa | C23C 16/4404 | 427/534 |
| 2011/0253044 A1* | 10/2011 | Tam | C23C 16/45519 | 118/666 |
| 2011/0256315 A1* | 10/2011 | Tam | C23C 16/45519 | 427/255.28 |
| 2011/0256645 A1* | 10/2011 | Tam | C23C 16/45519 | 438/14 |
| 2011/0256692 A1* | 10/2011 | Tam | C23C 16/45519 | 438/478 |
| 2011/0308551 A1* | 12/2011 | Chung | B08B 5/00 | 134/22.1 |
| 2012/0000490 A1* | 1/2012 | Chung | B08B 7/0035 | 134/22.12 |
| 2012/0027918 A1* | 2/2012 | Tiner | B05B 1/005 | 427/58 |
| 2012/0052216 A1* | 3/2012 | Hanawa | C23C 16/45565 | 427/582 |
| 2012/0064698 A1* | 3/2012 | Olgado | C23C 16/45565 | 438/478 |
| 2012/0067971 A1* | 3/2012 | Byun | C23C 16/45565 | 239/106 |
| 2012/0227665 A1* | 9/2012 | Ozgun | C23C 16/4411 | 118/666 |
| 2012/0234945 A1* | 9/2012 | Olgado | C23C 16/45565 | 239/589 |
| 2013/0052804 A1* | 2/2013 | Song | C23C 16/45565 | 438/478 |
| 2013/0298835 A1* | 11/2013 | Tam | C23C 16/45519 | 118/728 |
| 2013/0299009 A1* | 11/2013 | Jiang | F16L 53/00 | 137/334 |
| 2014/0302688 A1* | 10/2014 | Underwood | H01L 21/02216 | 438/786 |
| 2015/0000594 A1* | 1/2015 | Byun | C23C 16/40 | 118/715 |
| 2015/0007771 A1* | 1/2015 | Silva | C23C 16/301 | 118/715 |

FOREIGN PATENT DOCUMENTS

DE 102006018515 A1 10/2007
WO 2011/044451 A2 4/2011

OTHER PUBLICATIONS

International Search Report mailed Sep. 14, 2012, from the European Patent Office, for International Patent Application No. PCT/EP2012/063072 (filed Jul. 5, 2012), 7 pages.

Written Opinion mailed Sep. 14, 2012, from the European Patent Office, for International Patent Application No. PCT/EP2012/063072 (filed Jul. 5, 2012), 15 pages.

International Preliminary Examination Report mailed Jan. 14, 2014, from the International Bureau of WIPO, for International Patent Application No. PCT/EP2012/063072 (filed Jul. 5, 2012), 17 pages.

Purported Applicant's Informal Comments on Written Opinion of the International Search Authority dated Nov. 2, 2012, for International Patent Application No. PCT/EP2012/063072 (filed Jul. 5, 2012), 2 pages.

Communication regarding comments on written opinion/amendment of application/payment of claims fee dated Feb. 21, 2014, from the European Patent Office, for European Application No. 12734895.1 (filed Jul. 5, 2012), 3 pages.

Communication from the Examining Division dated Jul. 21, 2016, from the European Patent Office, for European Application No. 12734895.1 (filed Jul. 5, 2012), 4 pages.

(56) References Cited

OTHER PUBLICATIONS

Reply to communication from the Examining Division received Aug. 17, 2016, for European Application No. 12734895.1 (filed Jul. 5, 2012), 21 pages.

* cited by examiner

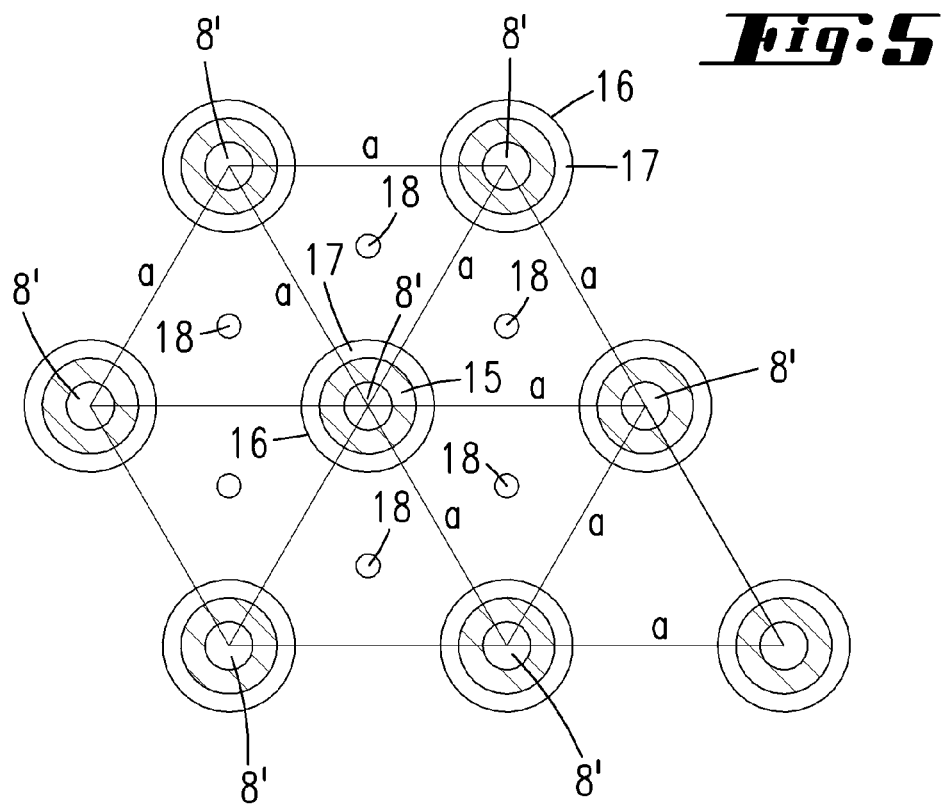
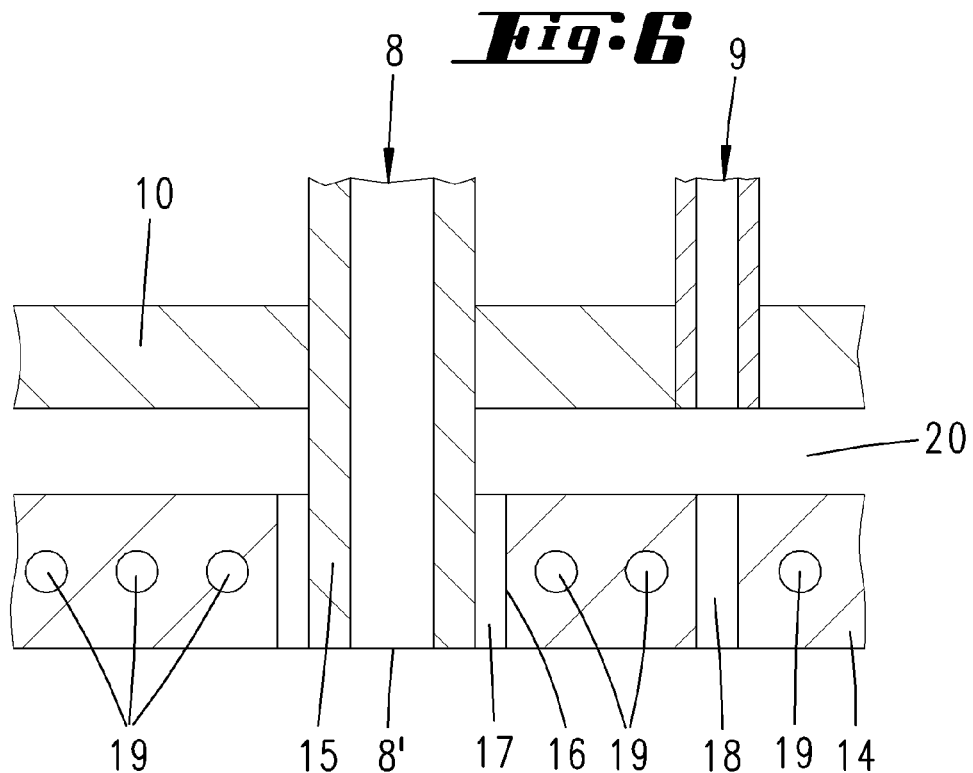

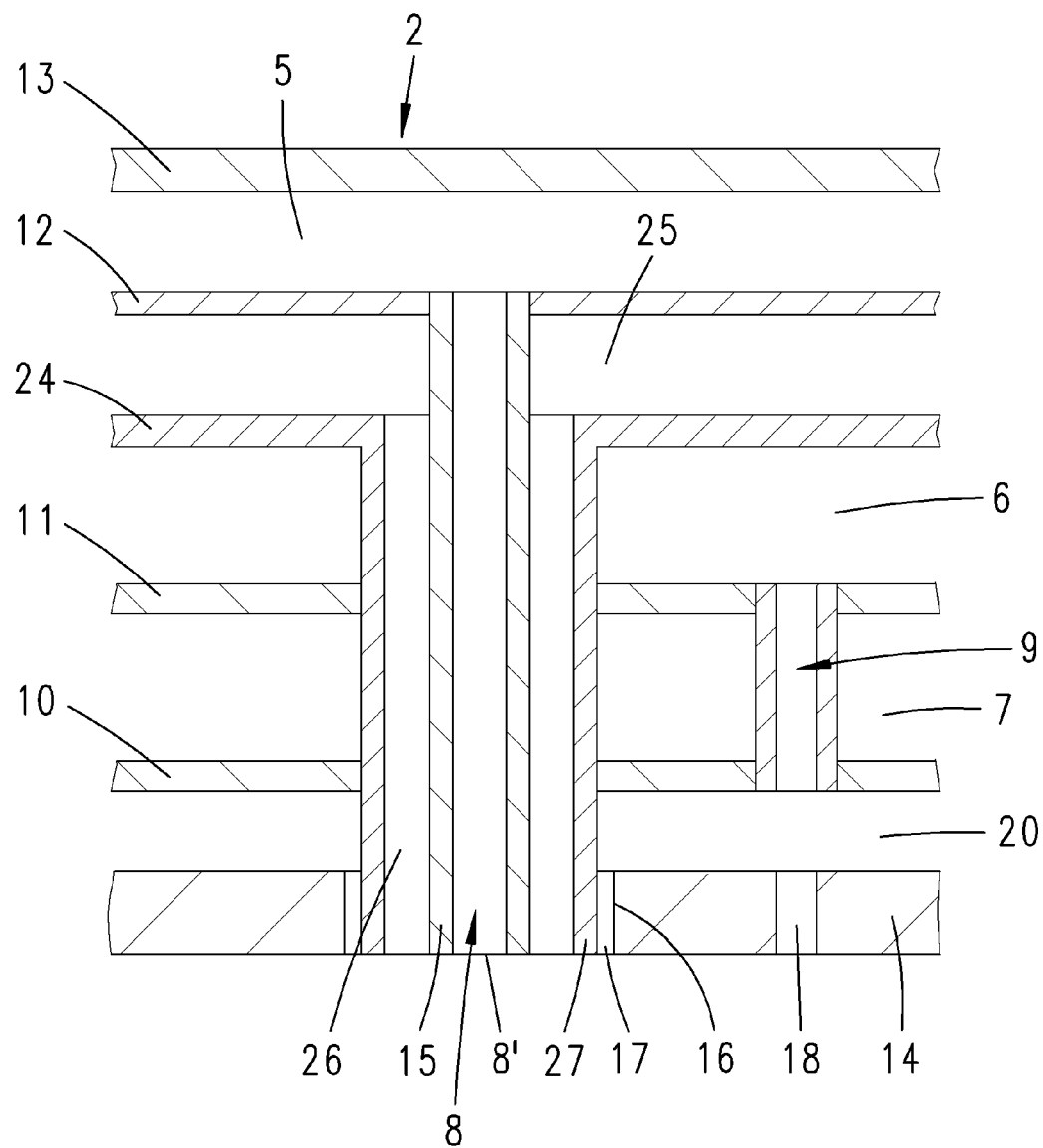

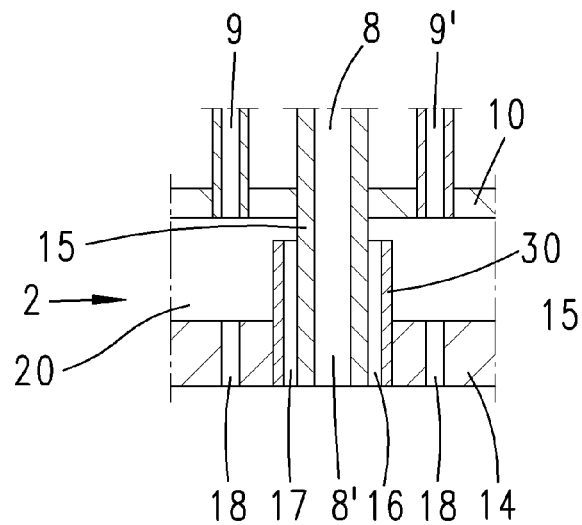
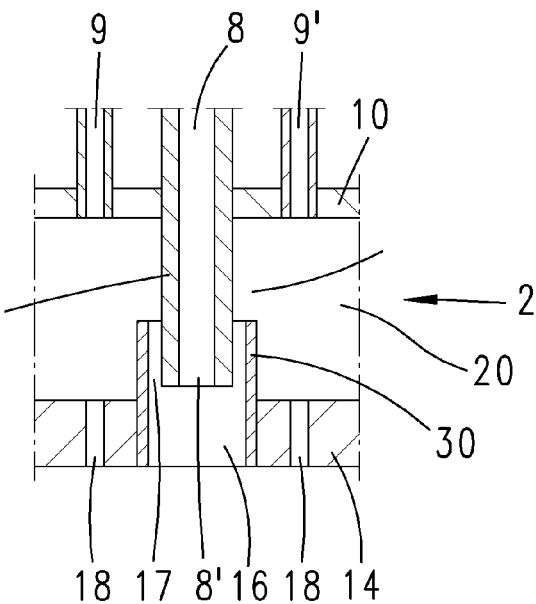
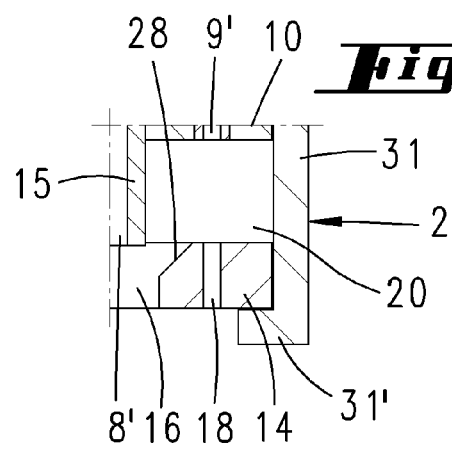
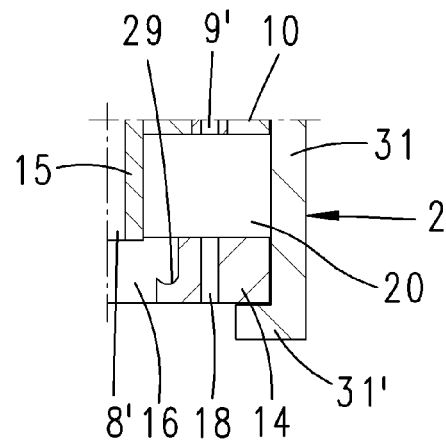
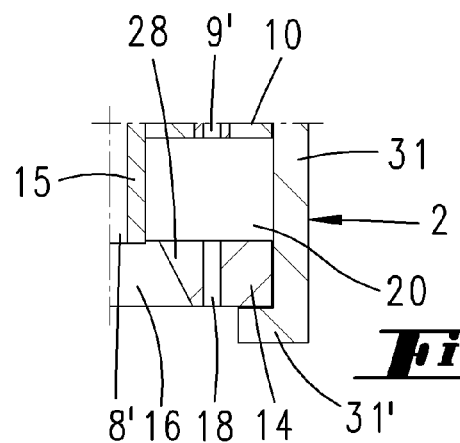

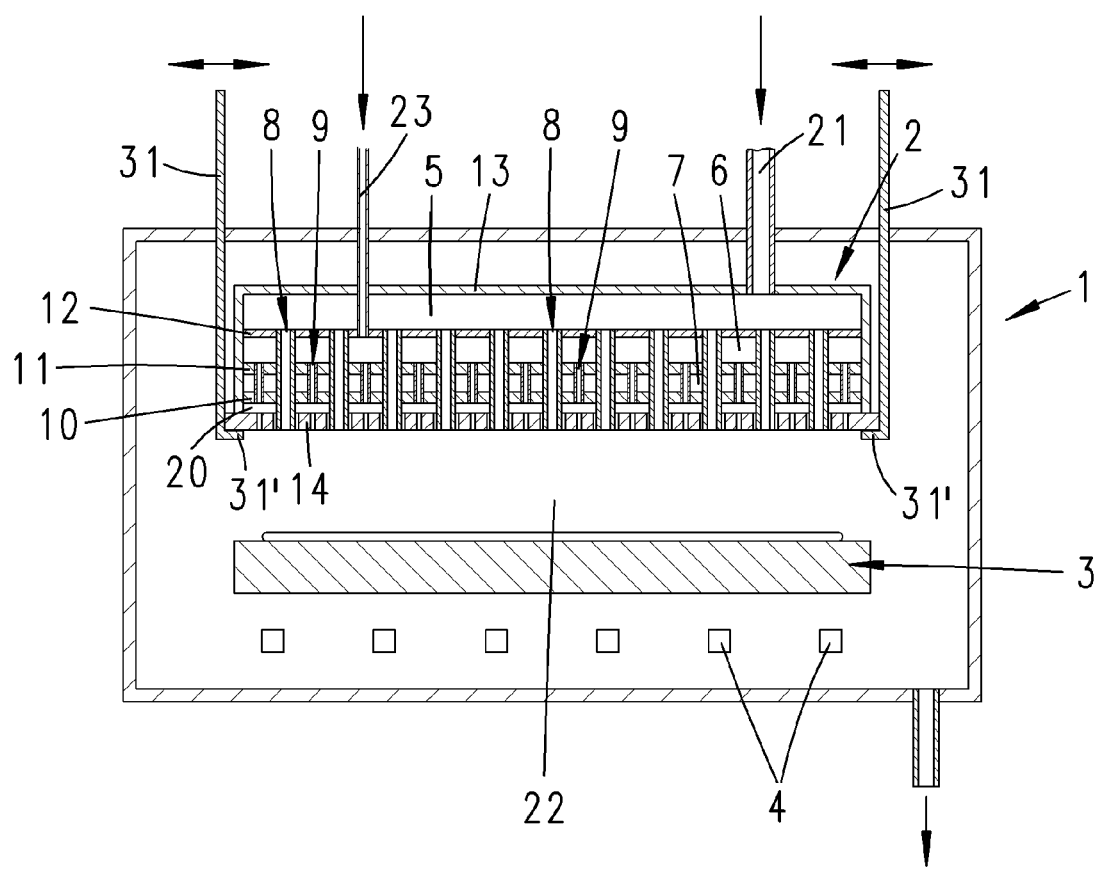

GAS INLET MEMBER OF A CVD REACTOR

CROSS REFERENCE TO RELATED APPLICATIONS

This is a NATIONAL STAGE under 35 USC 371 of and claims priority to International Application PCT/EP2012/063072, filed 5 Jul. 2012, incorporated herein by reference, which claims priority to DE 10 2011 051 778.2 filed 12 Jul. 2011 and DE 10 2011 056 589.2 filed 19 Dec. 2011.

FIELD OF THE INVENTION

The invention relates to a gas inlet member of a CVD reactor, comprising a gas inlet housing which has at least one first gas distribution volume that can be supplied with a first process gas by a first feed line and has a multiplicity of gas lines which are each formed as a tube and engage in first openings of a gas outlet plate arranged in front of an inlet housing wall, and through which the first process gas enters a process chamber located beneath the gas outlet plate, and further comprising a clearance space provided between the gas inlet housing wall and the gas outlet plate.

BACKGROUND

A gas inlet member is known from US 2009/0169744A1 and US 2006/0263522A1, in which a gas distribution volume is connected via tubes to the ceiling of a process chamber. Through the tubes, the process gas fed into the gas distribution volume can enter the process chamber located beneath the gas outlet plate. The process chamber ceiling here forms a gas outlet plate that forms a housing wall of a gas distribution volume.

DE 103 20 597 A1 describes a method and a device for depositing semiconductor layers using two process gases, the process gases being introduced into the process chamber through a gas inlet member.

DE 697 06 248 T2 describes a gas inlet member formed as a shower head, the gas lines of which are positioned on the vertices of triangles. Cooling chambers for cooling the gas inlet wall are present inside the gas inlet member.

U.S. Pat. No. 6,544,341 B1 describes a gas inlet member comprising a plurality of chambers arranged one above the other and having a multiplicity of gas outlet openings that are positioned on the vertices of equilateral triangles.

U.S. Pat. No. 7,976,631 B2 describes a gas inlet member that has cooled structures protruding out of the gas inlet housing wall toward the process chamber.

US 2006/0021574 A1 describes a gas inlet member, the process gas flowing through a porous gas outlet plate.

FIGS. 3 and 4 of DE 10 2006 018 515 A1 describe a gas inlet member which is part of a CVD reactor. The gas inlet member is shaped like a shower head and is arranged above a process chamber, the base of which is formed by a susceptor, on which substrates to be coated, in particular semiconductor substrates, can be placed. A gas outlet plate which is in contact with a gas inlet housing wall during the deposition process is present directly beneath the gas inlet member. The gas outlet plate can be displaced towards the susceptor for cleaning. Since the gas inlet housing wall of the gas inlet member is cooled and only the susceptor is heated, it is possible due to this measure to bring the gas outlet plate to a higher temperature so that by introducing an etching gas, for example HCl, parasitic deposits can be cleaned from the gas outlet plate.

In the case of CVD reactors having gas inlet members, the process chamber ceiling of which is formed by the gas inlet housing wall itself, parasitic growth occurs on the cooled gas inlet housing wall. This can result in undesirable particle formation within the process chamber. Moreover, the outlets of the gas feed lines can clog. This has the consequence that the gas inlet members have to be frequently mechanically cleaned. For cleaning the gas outlet side of the gas inlet member, the entire reactor housing has to be opened.

It is therefore an object of the invention to provide measures by which the cleaning cycles can be extended.

The gas outlet plate known from the above-mentioned prior art has openings for the process gas to pass through. Although the gas outlet plate is in contact with the cooled gas inlet wall, the gas outlet plate is still heated by heat conduction via the process gas through the process chamber, or via heat radiation from the susceptor. The outlet ends of the openings in the gas outlet plate can thus reach a temperature at which the process gas passing through the openings decomposes. The decomposition products can react with one another in the region of the outlet. This can also result in parasitic reactions in the gas phase, where undesirable adducts can form.

It is therefore a further object of the invention to provide measures by which undesirable pre-reactions can be reduced.

In the case of a CVD reactor in which the process chamber ceiling is cooled directly, the high heat dissipation requires that a high heat capacity must be provided in order to heat the susceptor to the desired process temperatures.

It is therefore a further object of the invention to increase the energy efficiency.

In a deposition process that uses hydrides, for example arsine or phosphine, which react in the process chamber together with organometallic compounds of main group III, moisture residues have negative effects on the layer growth.

It is therefore a further object of the invention to provide measures by which the moisture-inducing effects can be reduced.

At least one of these objects is achieved by the invention set forth in the claims.

SUMMARY OF THE INVENTION

First and foremost, it is proposed that the gas outlet plate is thermally decoupled with respect to the gas inlet housing wall. In contrast, the outlet ends of the gas lines are coupled to the cooled region of the gas inlet housing. If the lower side of the gas inlet member is heated by radiant heat from the heated susceptor of the process chamber, the process chamber ceiling in the region of the gas outlet plate can heat up more intensely than in the region of the outlets of the gas lines. For this purpose, the thermal conductivity of the material from which the gas outlet plate is made is lower than that of the material from which the gas lines are made. The gas lines through which a first process gas is introduced into the process chamber extend through the gas inlet housing wall. The gas lines are tubes that extend through the cooling chamber flushed by a coolant and connect the first gas distribution volume to the ceiling of the process chamber. According to the invention, these gas lines have extensions or are extended in such a manner that they extend as far as and into the openings of the gas outlet plate, which is spaced apart from the gas inlet housing wall. The gas lines can extend so far into the gas outlet plate that their outlets lie in the gas outlet plate surface facing the process chamber. The outlet areas do not have to be exactly flush in the surface of the gas outlet plate. Small steps, in particular of the size of a gap width around the gas lines, are possible, and may possibly be desirable. Furthermore, it is provided that the gas outlet plate is thermally decoupled with respect to the cooled gas inlet housing wall. For this purpose, the gas outlet plate is preferably spaced apart from the gas inlet housing wall by a clearance space in the form of a gap. This gap preferably extends over the entire surface of the gas outlet plate so that the gas outlet plate is connected only at its edge to the gas inlet member.

In a refinement of the invention, it is provided that with the gas inlet member formed like a shower head, at least one further process gas can be introduced into the process chamber. To this end, the gas inlet member forms a second gas distribution volume that likewise is connected to the gas inlet housing wall by means of tubes that form gas feed lines. The two gas distribution volumes can be arranged layered one above the other. The second gas feed lines through which the second process gas is introduced, which preferably is a hydride of the main group V, open into the gap between the gas inlet housing wall and the gas outlet plate. The outlets of the second gas lines lie flush in the gas inlet housing wall. The gas line extensions of the first gas lines, through which preferably an organometallic compound of an element of main group III is introduced into the process chamber, are preferably flush with the lower side of the gas outlet plate facing the process chamber. The openings through which the gas line extensions of the first gas lines protrude preferably have an opening width that is larger than the outer diameter of the gas line extensions, so that an annular gap is formed around the gas line extensions through which gas that is introduced into the gap between the gas inlet housing wall and the gas outlet plate can pass.

In a refinement of the invention, it is provided that the gas outlet plate has further openings through which the gas that is introduced into the gap can pass. This gas preferably is the second process gas, which can enter the process chamber in this manner. The gas outlet plate openings associated with the second process gas can be aligned with the outlets of the second gas lines. The tubes that form the first gas lines are preferably made of metal. The gas line extensions are integrally connected to the tubes. Thus, these are portions of the metal tubes which form the first gas lines and which project from the gas inlet housing wall. Due to this configuration, the outlet ends of the first gas lines are thermally coupled to the cooled portion of the gas inlet member. The outlets of the first gas lines are therefore kept at temperatures below the decomposition temperature of the first process gas that flows through the first gas lines into the process chamber. In contrast to these "cold" portions of the process chamber ceiling, the gas outlet plate can heat up. The gas outlet plate is thermally decoupled with respect to the cooled portion of the gas inlet member and is heated up by heat conduction or by heat radiation from the susceptor. While the first process gas enters the process chamber through "cold" discharge openings, the second process gas enters the process chamber through "hot" openings.

In a refinement of the invention which is of independent importance, it is provided that the first feed lines in the gas outlet plate are positioned on the vertices of equilateral triangles. This results overall in a hexagonal arrangement of the first feed lines in the gas discharge plane of the gas outlet plate. The second discharge openings in the gas outlet plate, through which the second process gas enters the process chamber, are preferably positioned on the centers of these triangles. Accordingly, the outlets of the second gas lines are also positioned on the vertices of equilateral triangles. The second process gas can enter the process chamber not only through these gas outlet plate openings associated with the second process gas, but also through the annular gap around the gas feed line extensions. However, a purge gas can also be introduced into the process chamber through these annular gaps so that contact between the two process gases is shifted into a region of hotter gas temperatures. For introducing a purge gas, it is also possible to structurally enhance the first gas lines. For example, the first gas lines can extend within a tube with a larger diameter, so that an annular gap is formed around the first gas lines through which a purge gas is introduced into the process chamber. The two tubes, which are nested into one another, open into the process chamber through the openings in the gas outlet plate. Here as well, a tube nested in this manner can be surrounded by an annular gap through which the second process gas is introduced into the process chamber. However, it is also possible for a further process gas to be introduced into the process chamber through the annular gap which is formed around the first gas line.

In a refinement of the invention, it is provided that the gas outlet plate is arranged in the reactor housing to be height-variable with respect to the gas inlet housing wall and the susceptor. If one or a plurality of substrates supported on the susceptor are to be coated with a layer in the process chamber, the gas outlet plate is in an operating position in which it is separated from the gas inlet housing wall by a small clearance space. The gas outlet plate is in a thermally decoupled position with respect to the gas inlet housing wall. The first gas lines protrude with their extensions into the openings of the gas outlet plate, the extensions being spaced at a lateral distance from the wall of the opening. A first process gas enters the process chamber through the extensions. The second process gas or a purge gas can enter the process chamber through the annular gap between the extensions and the opening wall. For cleaning the process chamber and in particular the gas outlet plate surface facing the process chamber, an etching gas can be introduced into the process chamber. Additionally or alternatively, however, for this purpose it is also possible to displace the gas outlet plate toward the heated susceptor and/or to increase the distance from the cooled gas inlet housing wall. By thus bringing the gas outlet plate closer to the hotter surface of the susceptor, the gas outlet plate can heat up to a higher temperature at which the parasitic deposits adhering to the lower side of the gas outlet plate can be removed. For vertical displacement, the device can have a lifting mechanism by means of which the distance between the gas inlet housing wall and the gas outlet plate can be varied. In a refinement of the invention, the gas outlet plate is secured on the lower side of the gas inlet member in such a manner that the gas outlet plate can be displaced in its direction of extent. By such horizontal displaceability of the gas outlet plate, the gas line extensions can be brought from an operating position, in which they freely extend into the openings, into another operating position in which in each case the wall of a cooled gas line extension rests against the wall of the opening. The gas outlet plate can thus be brought into heat-conductive contact with the gas line extensions. With these measures, it is possible to keep the gas outlet plate at temperatures below 450° C., preferably below 400° C., during the growth process. By modifying the position of the gas outlet plate with respect to the gas inlet housing wall, it is possible in a subsequent cleaning phase to bring the surface temperature of the gas outlet plate side facing the process chamber to temperatures greater than 500° C. The combination is particularly preferred in which the gas outlet plate is displaceable not only vertically, but also horizontally. In a refinement of the invention, the openings in the gas outlet plate are modified in such a way that they have a sleeve that protrudes into the clearance space. The sleeve forms a tube portion into which the first gas line protrudes in a telescopic manner. Due to this configuration, the vertical position of the gas outlet plate can vary over a relatively wide range without the outlet of the gas line extensions extending out of their associated sleeve and freely protruding into the clearance space. Thus, process gases exiting the outlet of the first gas line also cannot enter the clearance space, even if the distance between the gas inlet housing wall and the gas outlet plate is increased. Mixing of process gases thus takes place only within the opening that is extended by the sleeve. The second process gas enters the opening through the annular gap between the inner wall of the sleeve and the outer wall of the gas line extension. In a refinement of the invention, it is provided that the walls of the opening are profiled. For example, the openings of the gas outlet plate can have chamfers or counterbores. These profiles can be situated on the gas outlet plate side facing away from the process chamber. Moreover, such chamfers also facilitate assembly since they cause a self-centering effect. If there are tolerance errors, the chamfers minimize any thermal bridges between the gas line extensions and the opening edge. In this case, it can be advantageous if the profiles, i.e., the chamfers or counterbores, are located on the gas outlet plate side facing the process chamber. The growth rate at the edge thus also decreases, so that the operating time between two cleaning steps is extended. Finally, it is advantageous when the cross-section of the opening has a noncircular contour, in particular, has projections that protrude into the opening and can establish thermal contact with the gas line extensions during a horizontal displacement of the gas outlet plate.

Exemplary embodiments of the invention are explained below with reference to accompanying drawings. In the figures:

BRIEF DESCRIPTION OF THE DRAWINGS

FIG. 5 schematically shows the arrangement of the gas discharge openings in the gas outlet plate 14, FIG. 6 shows a second exemplary embodiment of the invention in an illustration according to FIG. 4, FIG. 7 shows a third exemplary embodiment of the invention in an illustration according to FIG. 4, FIG. 11 shows a fifth exemplary embodiment of the invention in a growth process position, in which the opening 16 is formed by a sleeve 30 that protrudes into the clearance space 20, FIG. 12 shows an illustration according to FIG. 11, but with the gas outlet plate 14 lowered, FIG. 13 shows as a sixth exemplary embodiment, an illustration according to FIG. 2 with a profiled wall of the opening 16, which is formed as a bevel facing toward the clearance space 20, FIG. 14 shows as a seventh exemplary embodiment, an illustration according to FIG. 13, the profile of the wall of the opening 16 being formed as a circumferential ring groove, the opening of which faces the clearance space 20, FIG. 15 shows as an eighth exemplary embodiment a further variant of a profile of the opening wall 16, in this case a bevel 28 facing the process chamber, FIG. 16 shows a ninth exemplary embodiment of the invention in an illustration according to FIG. 1, the gas outlet plate 14 being displaceable not only in the vertical direction but also in the horizontal direction.

DETAILED DESCRIPTION

Figure 1:
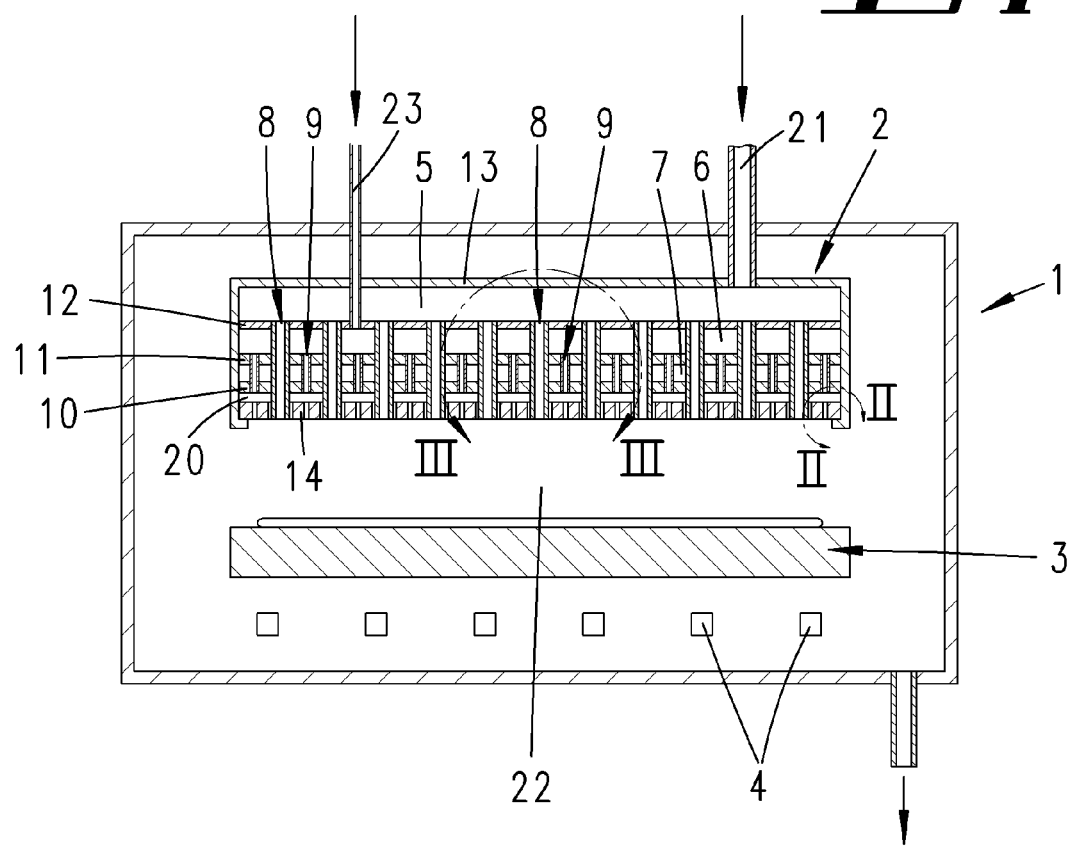
FIG. 1 schematically shows the structure of a reactor housing of a CVD reactor.

The CVD reactor according to the invention has a gas storage and metering system, not illustrated, in which the process gases are mixed with carrier gases and fed through lines to the CVD reactor. In FIG. 1, in which the cross-section of a reactor housing 1 is illustrated, only two gas feed lines 21, 23 for a first process gas and a second process gas, respectively, are illustrated. The feed lines 21, 23 each open into gas distribution volumes 5 and 6, respectively. The gas distribution volumes 5, 6 lie one above the other and are separated from one another by a separator plate 12. Each gas distribution volume 5, 6 is connected via separate tubes, which form the gas lines 8, 9, to a gas inlet housing wall 10. The process gas exiting the outlets of the gas lines 8, 9 reaches a process chamber 22 situated below the gas inlet member 2, the base of the process chamber being formed by a susceptor 3. One or a plurality of substrates to be coated are present on the susceptor 3. The susceptor 3 is heated to a process temperature from below by means of a heater 4. The temperature can range between 500° and 1000° Celsius. The reactor housing 1 is connected to a vacuum pump, not illustrated, so that total pressures of typically 50 to 800 mbar can be set inside the process chamber. The diameter of the susceptor 3 corresponds to approximately 300 mm to 600 mm. The diameter of the gas inlet member 2, which is shaped like a shower head, corresponds approximately to the diameter of the susceptor 3.

Directly above the gas inlet housing wall 10, a coolant chamber 7 is present through which a coolant flows so that the gas inlet housing wall 10 is temperature-controlled to a temperature between 60° and 200° Celsius.

A gas-flushed gap 20 is present below the gas inlet housing wall 10. The second gas lines 9 associated with the second process gas open into the gap 20. The gas lines are formed by tubes that pass through the coolant chamber 7.

The first gas lines 8, which likewise are formed from tubes and through which the first process gas flows, traverse not only the coolant chamber 7 but also the second gas distribution volume 6. The tubes forming the first gas lines 8 continue through the gas inlet housing wall 10 and form gas line extensions 15 which initially traverse the gap 20 and then enter an opening 16 in a gas outlet plate 14.

Figure 2:
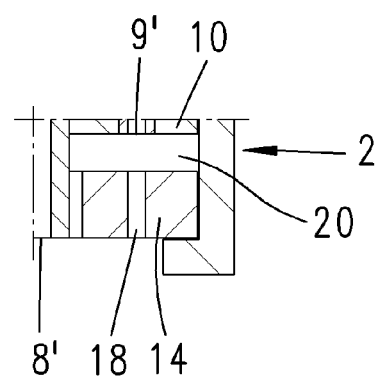
FIG. 2 shows the detail II-II in FIG. 1.
Figure 3:
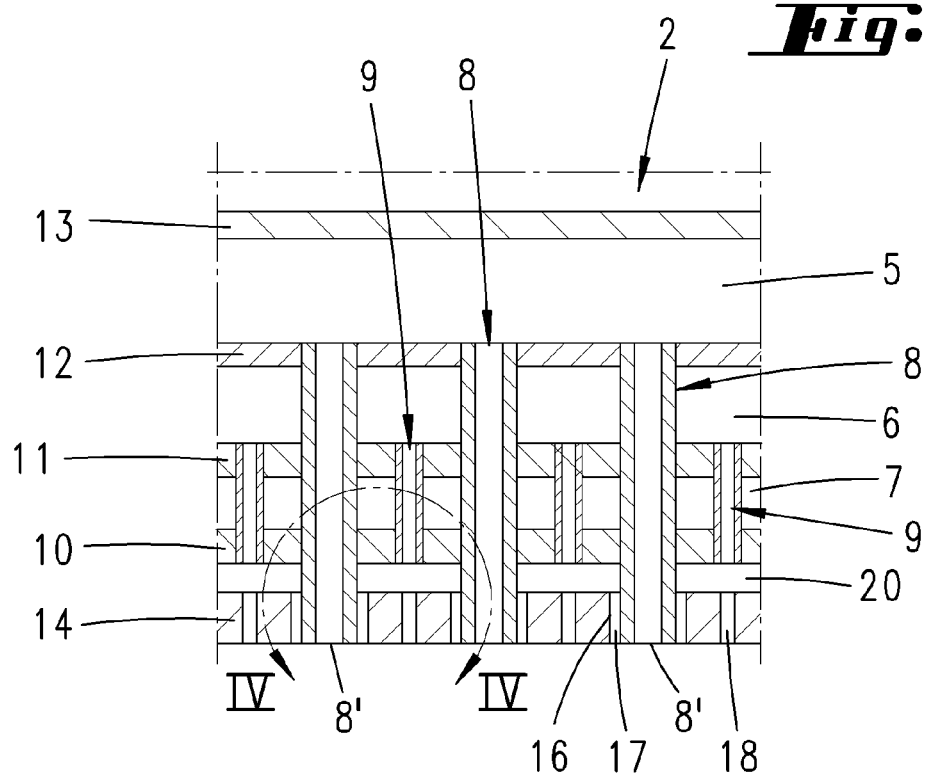
FIG. 3 shows the detail III-III in FIG. 1.
Figure 4:
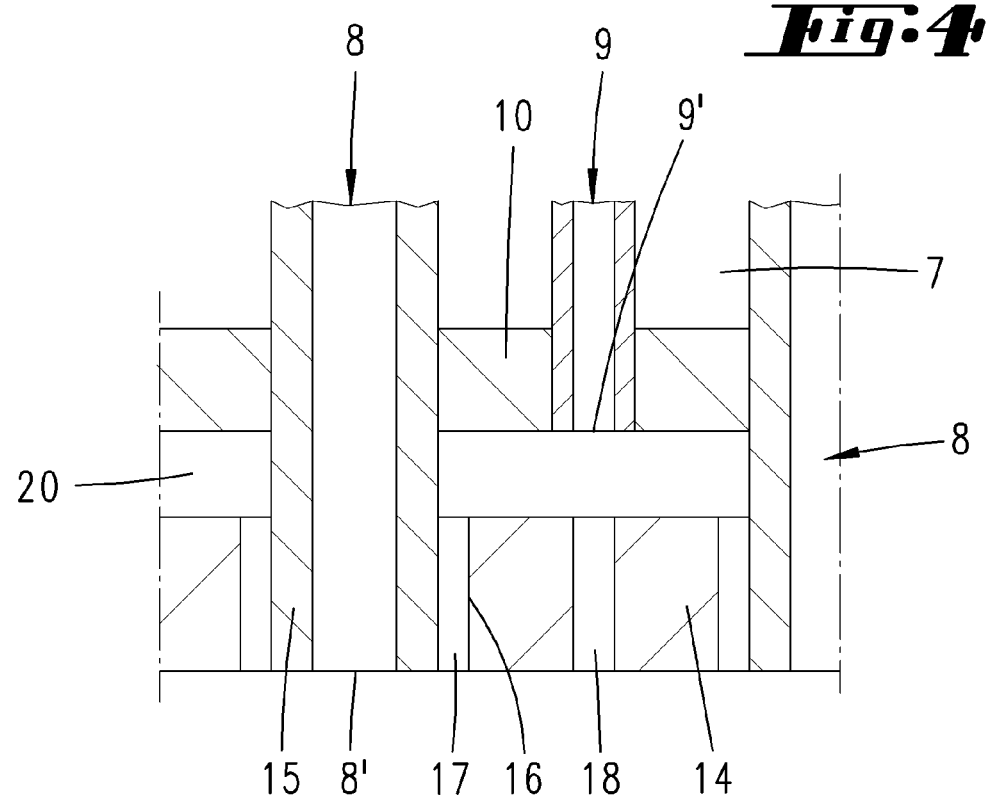
FIG. 4 shows the detail IV-IV in FIG. 3.

The gas outlet plate 14 is held only at its edge, which is circular in the exemplary embodiment. As can be seen from FIG. 2, the gas outlet plate is held at the edge, supported from below in the exemplary embodiment, by a wall which forms the edge of the gas inlet member 2.

The gas outlet plate 14 can be made of a heat-conductive or a nonheat-conductive material. The gas outlet plate 14 can be made of quartz, graphite or a metal.

The openings 16 into which the gas line extensions 15 extend have a larger diameter than the gas lines 8, so that an annular gap 17 is formed around each of the outlet portions of the gas lines 8. The outlets 8' of the gas lines 8 are flush with the surface of the gas outlet plate 14 facing the process chamber 22.

The gas outlet plate 14 has further openings 18 with a smaller diameter than the openings 16. The openings 18 are in an aligned position with the outlets 9' of the second gas lines 9.

The intermediate wall 11 which delimits the cooling chamber 7 from the second gas distribution volume 6, the intermediate wall 12 which separates the two gas distribution volumes 5, 6 from one another, the gas inlet housing wall 13 through which the feed lines 21, 23 pass, and the gas inlet housing wall 10 run parallel to one another. The gas inlet housing wall 10 runs in the horizontal direction. The gas outlet plate 14 likewise runs in the horizontal direction. In this respect, the gas outlet plate 14 runs substantially parallel to the gas inlet housing wall 10. Both plates (the gas outlet plate 14 and also the gas inlet housing wall 10) do not have to have smooth surfaces. Although the preferred exemplary embodiment illustrated in the drawings shows flat surfaces, the surfaces of the gas inlet housing wall 10 and the surfaces of the gas outlet plate 14 can also be structured or profiled.

In the exemplary embodiment illustrated in FIGS. 1 to 4, the gas inlet housing wall 10 is actively cooled. The susceptor 3 is actively heated. A first process gas in the form of an organometallic compound of an element of main group III is introduced through the feed line 23. This takes place together with a carrier gas. A hydride of an element of main group V is likewise introduced together with a carrier gas through the feed line 21. These gases exit the outlets 8' and 9', respectively, and enter the process chamber 22 and heat up therein. Gas phase reactions take place in which the process gases are pre-decomposed or intermediate products are formed. As a result of pyrolytic decomposition of the process gases III-V, layers are deposited on the surface of the substrate.

The organometallic components enter the process chamber 22 through the first gas lines 8. Since the first gas lines are thermally coupled to the coolant chamber 7, the outlets 8' of the first gas lines have a temperature that is lower than the decomposition temperature of the first process gas. Since the gas outlet plate 14 is thermally decoupled with respect to the coolant chamber 7 and the gas inlet housing wall 10, its surface facing the process chamber 22 has a significantly higher temperature. During a growth process, this temperature can range between 250° and 600° C. The heat transfer between the susceptor 3 and the cooling chamber 7 is thus reduced, thereby increasing the energy efficiency of the CVD reactor. At the same time, a certain thermal activation of the second process gas takes place, the second process gas being less reactive than the first process gas.

With the configuration according to the invention of the gas inlet member 2, the process chamber ceiling can be etched in situ. Moreover, due to the hot process chamber ceiling, deposition of parasitic reaction products in the process chamber is reduced, and the nature of the deposit changes. The parasitic deposit deposited in the process chamber according to the invention has a higher stability. During etching, the process chamber ceiling, i.e., the lower side of the gas outlet plate 14, is heated to temperatures above 500° Celsius and, if necessary, even up to 1,000° C. This takes place substantially due to heat radiation or heat conduction from the susceptor via the gas in the process chamber. HCl, optionally together with a carrier gas, for example $N_2$ or $H_2$, can be introduced through the gas lines 8 and/or the gas lines 9.

Since during the operation of the device, the gas inlet housing wall 10 and the gas outlet plate 14 have temperatures that differ significantly from one another, and a uniform gas supply has to be ensured, the dimensions of the annular gaps 17 and of the clearance space must be selected accordingly. In addition to the thermal expansion of the gas outlet plate 14, the influences of gravity must also be taken into account since the gas outlet plate 14 is held only at the edge. The diameters of the openings 16 are in any case selected in such a way that no stresses are transmitted to the gas line extensions 15 during thermal expansion of the gas outlet plate 14.

In the exemplary embodiment illustrated in FIG. 6, the gas outlet plate 14 has temperature-regulating channels 19. A hot or cold liquid can flow through these temperature-regulating channels 19, so that not only can the gas outlet plate 14 be hotter than the gas inlet member 2, but it may also be arranged to heat up the gas inlet member 2 and to cool the gas outlet plate 14, for example if a layer is to be deposited by condensation onto a substrate supported on the susceptor 3.

In a preferred configuration, the gas lines that are illustrated only in a simplified cross-section in FIGS. 1 to 4 do not lie in a common cross-sectional plane.

FIG. 5 shows that the first gas lines 8 or the outlets 8' thereof are positioned on the vertices of an equilateral triangle. Thus, each outlet 8' is spaced at the same distance a from the outlet 8' nearest to it, resulting in a hexagonal arrangement.

The openings 18 of the gas outlet plate 14 through which the second process gas flows into the process chamber are likewise positioned in a hexagonal association with one another. The openings lie approximately in the centers of the equilateral triangles having the edge length a.

While in the exemplary embodiments illustrated in FIGS. 1 to 4 and 6, the second process gas can also enter the process chamber through the annular gaps 17 and therefore can come into contact with the first process gas directly in front of the outlet 8', in the exemplary embodiment illustrated in FIG. 7, an additional annular flow channel 26 is provided. For this purpose, the tube forming the first gas line 8 is surrounded by a tube 27 that has a larger diameter. A purge gas which is fed into a further gas distribution volume 25 can be introduced into the process chamber 2 purge gas through the gap 26 between the tubes 8 and 27. The gas distribution volume 25 is separated from the gas distribution volume 6 by an intermediate wall 24. The intermediate wall 12 separates the gas distribution volume 25 from the gas distribution volume 5.

Due to the purge gas exiting the annular gap 17, the first process gas exiting the outlet 8' comes into contact with the second process gas exiting the gap 17 only in a hotter region of the process chamber 2. A further measure is thus provided so as to reduce adduct formation or other parasitic reactions in the process chamber. The gas outlet plate 14 can be formed in one or multiple parts. Moreover, the gas outlet plate 14 forms a temperature shield of the cooled gas inlet member 2. The gas outlet plate 14 can be heated up by the heat radiation emanating from the susceptor 3. Only cold islands remain in the region of the outlets 8'.

The exemplary embodiment illustrated in FIG. 7 can also be operated in a different manner; for example, a further process gas can be introduced into the process chamber through the annular channel 26. A purge gas or also a process gas can be introduced into the process chamber 22 through the gas lines 8.

Figure 8:
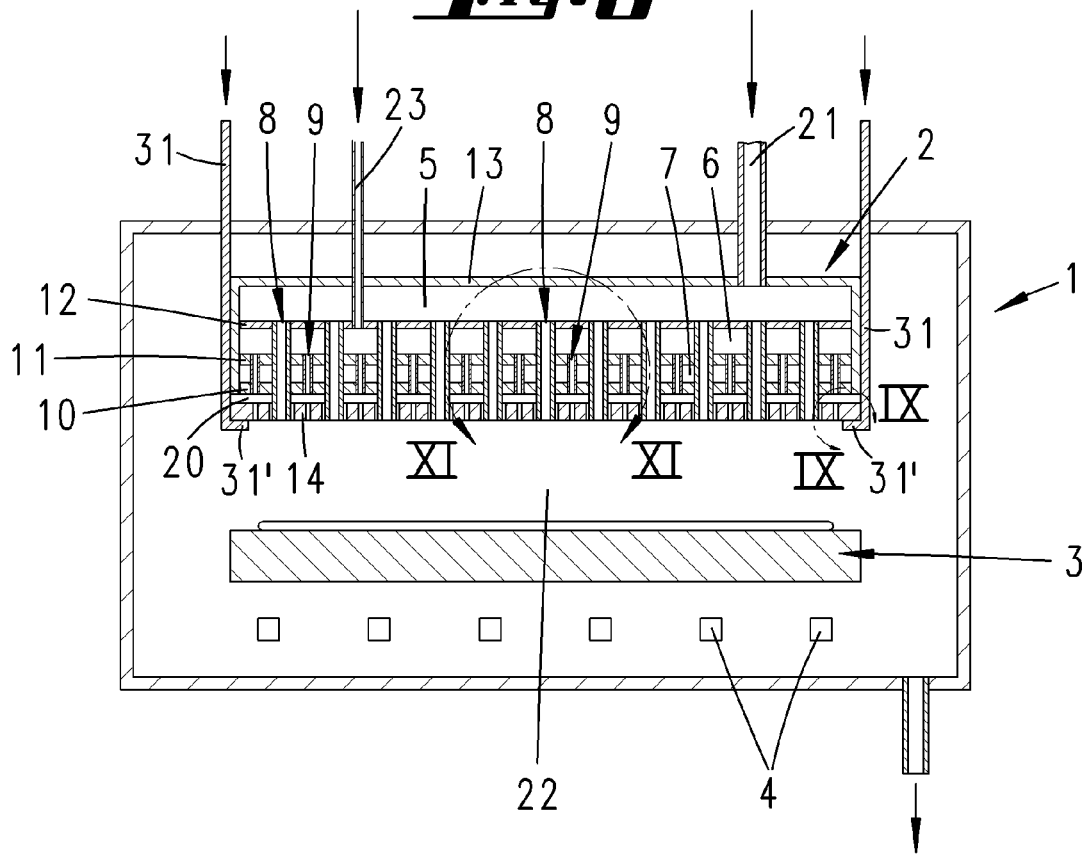
FIG. 8 shows a fourth exemplary embodiment of the invention in an illustration according to FIG. 1 in a growth operating position, the gas outlet plate 14 being displaceable in the vertical direction.
Figure 9:
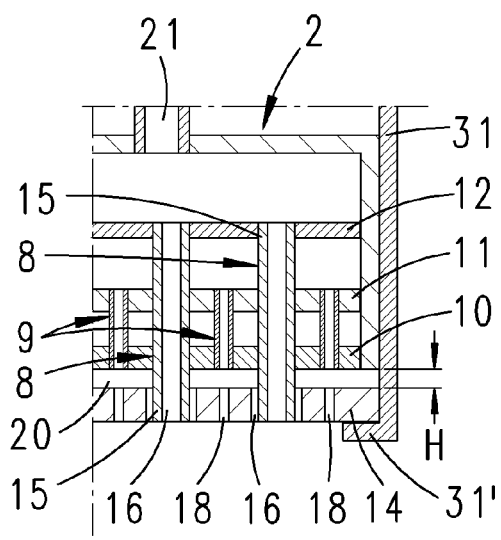
FIG. 9 shows the enlarged detail IX-IX in FIG. 8.

Depending on the height H of the clearance space 20 and the output of the heater 4, there is an upper limit of the maximum temperature to which the lower side of the gas outlet plate 14 can be heated. In a growth process, the temperature of the lower side of the gas outlet plate is at a temperature lower than 450° C. or even lower than 400° C. However, in a cleaning step, the temperature should be at least 500° C. To be able to achieve this with simple means, the capability for changing the position of the gas outlet plate 14 is provided in the exemplary embodiments illustrated in FIGS. 8 to 18. For this purpose, the reactor has a displacement means 31 by means of which the gas outlet plate 14 can be displaced in the vertical direction. Hooks 31' engage from below with the edge of the gas outlet plate 14. FIG. 8 shows the gas outlet plate 14 in a production process position in which the gas outlet plate 14 is brought to a height at which the outlet 8' of the first gas line 8 is flush with the lower side of the gas outlet plate 14. The tubular gas line extensions 15 formed by the first gas lines 8 protrude into the openings 16 of the gas outlet plate 14 while leaving an annular gap therebetween.

Figure 10:
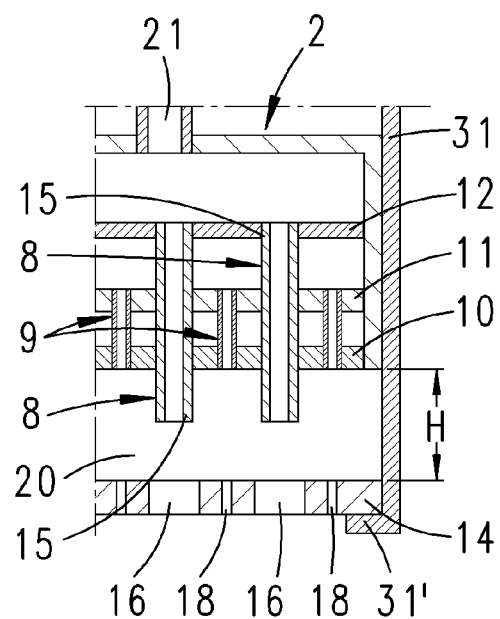
FIG. 10 shows an illustration according to FIG. 9, but with the gas outlet plate 14 lowered in the vertical direction.

The dimension of the height H of the clearance space 20 can be increased. This takes place by lowering the gas outlet plate 14 by means of the lifting elements 31. In doing so, the gas outlet plate 14 moves away from the cooled gas inlet housing wall 10 and approaches the heated top side of the susceptor 3. As can be seen in FIG. 10, the gas line extensions 15 then no longer protrude into the openings 16. In this operating position, the gas outlet plate 14 can heat up to over 500° C. during the cleaning process. In the exemplary embodiment, lifting elements 31 are provided so as to displace the gas outlet plate 14 between the stationarily-held gas inlet member 2 and the susceptor 3 that is held stationary relative thereto. However, alternative configurations are also possible; for example, the distance H can also be increased by lifting the gas inlet member 2. It is also conceivable to lower the entire assembly comprising the gas inlet member 2 and the gas outlet plate 4 toward the susceptor 3, or to lift the susceptor 3 toward the assembly. It is important in each case that the ratio of the distances between the gas outlet plate 14 and the gas inlet member 2 on the one hand, and between the gas outlet plate 14 and the susceptor 3 on the other, changes.

In the fifth exemplary embodiment illustrated in FIGS. 11 and 12, the openings 16 are formed by sleeves 30 which are inserted into corresponding openings of the gas outlet plate 14. The sleeves 30 are flush with the surface of the gas outlet plate 14 that faces the process chamber, but protrude into the clearance space 20. In this configuration, the gas outlet plate 14 can be lowered without the outlet 8' of the first gas line 8 leaving the opening 16. Also, in the lowered position of the gas outlet plate 14, the annular gap 17 between the outer wall of the gas line extension 15 and the inner wall of the opening 16, i.e., the inner wall of the sleeve 30, is maintained. The sleeve 30 can be made of a suitable material, for example a metal, graphite, coated graphite or quartz. The sleeve is inserted into an opening of the gas outlet plate 14. The sleeve can also be held there in a positive-locking manner.

The sixth exemplary embodiment illustrated in FIG. 13 shows a profile of the wall of the opening 16. The profile 28 is formed there by a chamfer that is provided on the side of the gas outlet plate 14 that faces the gas inlet housing wall 10.

The seventh exemplary embodiment illustrated in FIG. 14 shows a differently shaped profile 29 of the wall of the opening 16. The profile 29 is formed here by a step, the step forming a groove that opens toward the side facing away from the process chamber.

In the eighth exemplary embodiment illustrated in FIG. 15, the opening 16 has a wall profile 28 that is formed as a chamfer. The entire opening wall extends on the inner surface of a truncated cone, the truncated cone-shaped space opening toward the process chamber.

The ninth exemplary embodiment illustrated in FIG. 16 shows a gas outlet plate 14 that is displaceable in the horizontal direction. As the result of a horizontal displacement, the openings 16 can be brought into heat-conductive contact with the cooled gas line extensions 15.

Figure 17:
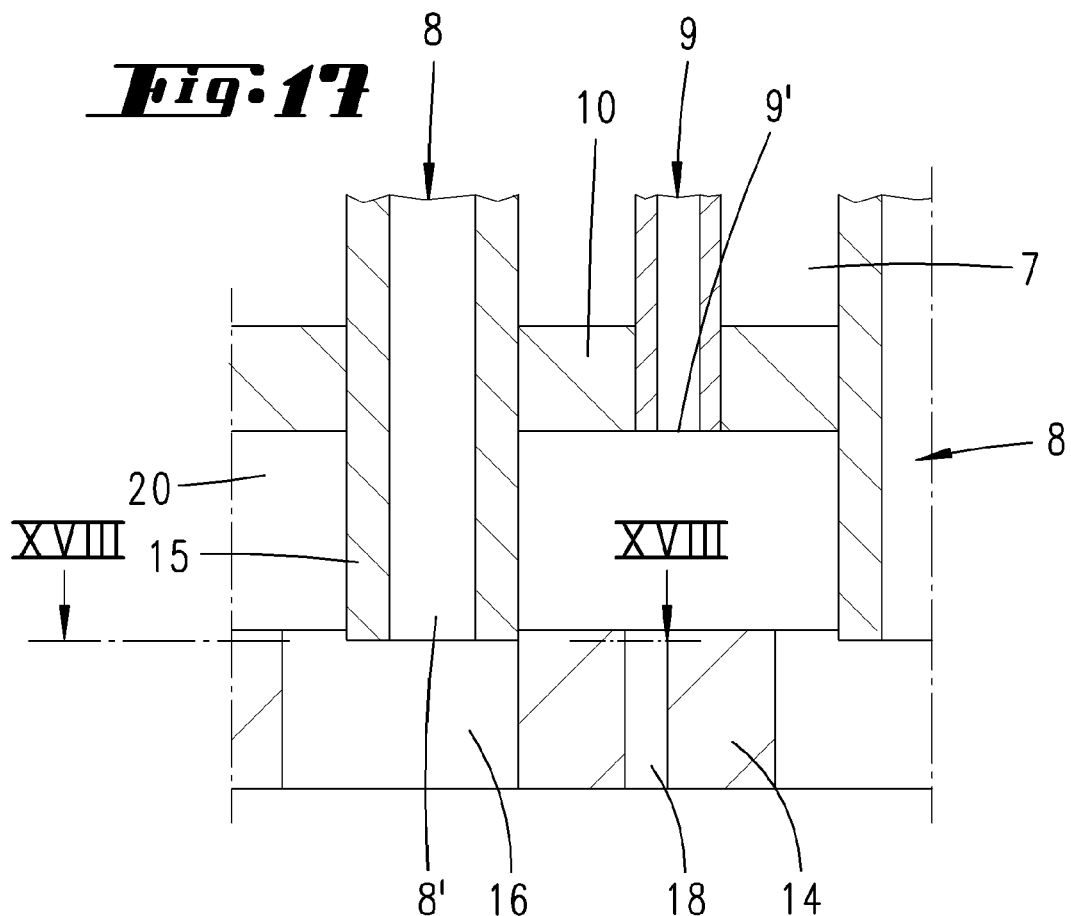
FIG. 17 shows an enlarged illustration of the gas line extension 15 that protrudes into the opening 16 when the gas outlet plate 14 is lowered, the wall of the gas line extension being brought in heat-conductive contact with the opening wall due to a horizontal displacement of the gas outlet plate 14.

FIG. 17 shows an enlarged illustration in which the thermal contact is established by horizontally displacing the gas outlet plate 14. Here, the gas outlet plate 14 has been in addition lowered in the vertical direction.

Figure 18:
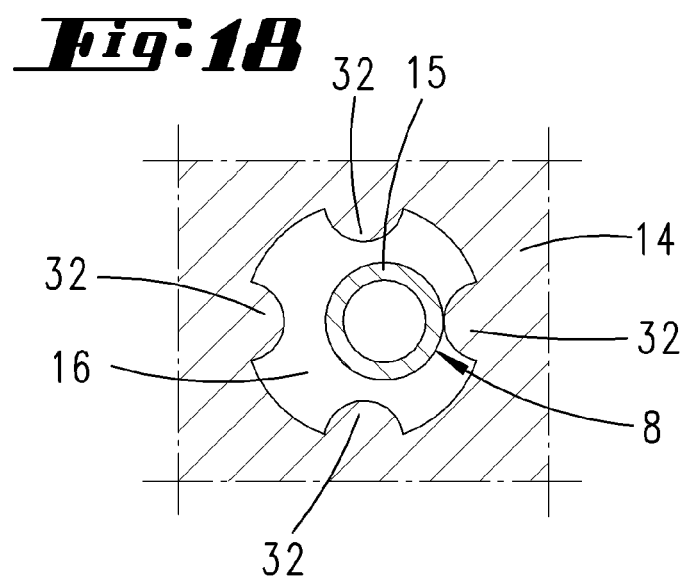
FIG. 18 shows the section according to the line XVIII-XVIII, the circumferential contour line of the opening 16 being configured here to be noncircular due to four projections 23 being provided that protrude radially into the opening, one projection 32 being in contact with the gas line extension 15.

FIG. 18 shows a specially shaped cross-sectional contour of an opening 16. Four semicircular projections 32 protrude into the clearance space of the opening 16 from a circular baseline in uniform angular distribution. By means of the vertical displacement, one of the projections 32 can be brought into heat-conductive contact with the gas line extension 15.

All features disclosed are (in themselves) pertinent to the invention. The disclosure content of the associated/accompanying priority documents (copy of the prior application) is also hereby included in full in the disclosure, including for the purpose of incorporating features of these documents in the claims in the present application. The subsidiary claims in their optional subordinated formulation characterize independent inventive refinements of the prior art, in particular to undertake divisional applications based on these claims.

| List of reference numerals | |
| --- | --- |
| 1 | Reactor housing |
| 2 | Gas inlet member |
| 3 | Susceptor |
| 4 | Heater |
| 5 | First gas distribution volume |
| 6 | Second gas distribution volume |
| 7 | Coolant chamber |
| 8 | First gas line |
| 8' | Outlet |
| 9 | Second gas line |
| 9' | Outlet |
| 10 | Gas inlet housing wall |
| 11 | Intermediate wall |
| 12 | Intermediate wall |
| 13 | Gas inlet housing wall |
| 14 | Gas outlet plate |
| 15 | Gas line extension |
| 16 | Opening |
| 17 | Annular gap |
| 18 | Opening |
| 19 | Temperature-regulating channel |

-continued

| List of reference numerals | |
|---|---|
| 20 | Clearance space |
| 21 | Feed line |
| 22 | Process chamber |
| 23 | Feed line |
| 24 | Intermediate wall |
| 25 | Gas distribution volume |
| 26 | Flushing gas line |
| 27 | Tube |
| 28 | Profile |
| 29 | Profile |
| 30 | Sleeve |
| 31 | Displacement means |
| 31' | Hook |
| 32 | Projection |
| a | Edge length |
| H | Height |

What is claimed is:

1. A gas inlet member (2) of a chemical vapor deposition (CVD) reactor, comprising a gas inlet housing which has at least one first gas distribution volume (5) that can be supplied with a first process gas by a first feed line (21) and has a multiplicity of first gas lines (8) which are each formed as a tube and have extensions (15) that engage in first openings (16) of a gas outlet plate (14) arranged in front of a gas inlet housing wall (10), and through which the first process gas enters a process chamber located beneath the gas outlet plate (14), and further comprising a clearance space (20) provided between the gas inlet housing wall (10) and the gas outlet plate (14), and a coolant chamber (7) that adjoins the gas inlet housing wall (10) and into which a coolant can be fed so as to cool the gas inlet housing wall (10), wherein the gas inlet housing has a second gas distribution volume (6) which can be fed by a second feed line (23) and which is connected to the gas inlet housing wall (10) via a multiplicity of second gas lines (9), wherein the second gas lines (9) open into the clearance space (20), characterized in that outlet (8') ends of extensions (15) of the gas lines (8) are in heat-conductive contact with the cooled gas inlet housing wall (10), and the gas outlet plate (14) is thermally decoupled with respect to the gas inlet housing wall (10) in such a manner that the gas outlet plate (14), which is acted on by radiation heat from a process chamber (22), heats up more intensely than the outlet (8') ends which extend into the first openings (16) of the gas outlet plate (14).

2. The gas inlet member (2) according to claim 1, further characterized in that the outlet (8') ends of the first gas lines (8) are substantially flush with a surface of the gas outlet plate (14) facing the process chamber (22), or can be brought into a position flush with said surface by vertically displacing the gas outlet plate (14).

3. The gas inlet member (2) according to claim 1, further characterized in that the gas outlet plate (14) has second openings (18) through which a second process gas can enter the process chamber (22).

4. The gas inlet member (2) according to claim 3, further characterized in that gas line extensions (15), with which the first gas lines (8) protrude into the first openings (16) associated with the first gas lines, have an outer diameter that is smaller than an opening width of the first openings (16), so that each of the gas line extensions (15) is surrounded by an annular gap (17).

5. The gas inlet member (2) according to claim 4, further characterized in that the outlet (8') ends of the first gas lines (8) in the gas outlet plate (14) are positioned on vertices of equilateral triangles.

6. The gas inlet member (2) according to claim 5, further characterized in that the second openings (18) are positioned on centers of the equilateral triangles.

7. The gas inlet member (2) according to claim 1, further characterized in that each of the first gas lines (8) is surrounded by a purge gas or process gas line (26), that is fed by a third gas distribution volume (25).

8. The gas inlet member (2) according to claim 1, further characterized in that the gas outlet plate (14) is temperature-controlled and includes temperature-regulating channels (19).

9. The gas inlet member (2) according to claim 1, further characterized in that a distance (H) between the gas inlet housing wall (10) and the gas outlet plate (14) and a distance of the gas outlet plate (14) from a susceptor (3) can be varied by means of a displacement device (31).

10. The gas inlet member (2) according to claim 1, further characterized in that, for each of the first openings (16), the first opening (16) is an interior of a sleeve (30) that extends into the clearance space (20).

11. The gas inlet member (2) according to claim 1, further characterized in that the thermal conductivity of the gas outlet plate (14) is less than the thermal conductivity of the first gas lines (8).

12. A gas inlet member (2) of a chemical vapor deposition (CVD) reactor, comprising a gas inlet housing which has at least one first gas distribution volume (5) that can be supplied with a first process gas by a first feed line (21) and has a multiplicity of first gas lines (8) which are each formed as a tube and have extensions (15) that engage in first openings (16) of a gas outlet plate (14) arranged in front of a gas inlet housing wall (10), and through which the first process gas enters a process chamber located beneath the gas outlet plate (14), and further comprising a clearance space (20) provided between the gas inlet housing wall (10) and the gas outlet plate (14), wherein the extensions (15) have an outer diameter that is smaller than an opening width of the first openings (16), so that each of the extensions (15) is surrounded by an annular gap (17), characterized in that the gas outlet plate (14) is displaceable in a direction parallel to its plane of extent in such a manner that the gas outlet plate (14) can be brought into heat-conductive contact with the extensions (15).

13. The gas inlet member (2) according to claim 12, further characterized by a profile (28, 29) of the first openings (16) which influences gas flow through the first openings (16).

* * * * *